(12) United States Patent
Jo et al.

(10) Patent No.: US 7,867,797 B2
(45) Date of Patent: Jan. 11, 2011

(54) METHOD OF FABRICATING ORGANIC LIGHT EMITTING DIODE DISPLAY DEVICE

(75) Inventors: Soo-Beom Jo, Suwon-si (KR); Jong-Mo Yeo, Suwon-si (KR); Jong-Hoon Son, Suwon-si (KR); In-Young Jung, Suwon-si (KR); Kyung-Jin Yoo, Suwon-si (KR); Dae-Hyun No, Suwon-si (KR); Do-Hyun Kwon, Suwon-si (KR); Choong-Youl Im, Suwon-si (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 0 days.

(21) Appl. No.: 12/209,558

(22) Filed: Sep. 12, 2008

(65) Prior Publication Data

US 2009/0075438 A1    Mar. 19, 2009

(30) Foreign Application Priority Data

Sep. 14, 2007  (KR) ................. 10-2007-0093538

(51) Int. Cl.
*H01L 21/00* (2006.01)
(52) U.S. Cl. .............. 438/30; 438/149; 438/677; 438/734; 438/781; 257/59; 257/E21.241
(58) Field of Classification Search .................. None
See application file for complete search history.

(56) References Cited

U.S. PATENT DOCUMENTS

| | | | |
|---|---|---|---|
| 5,744,402 A | 4/1998 | Fukazawa et al. | |
| 6,221,772 B1* | 4/2001 | Yang et al. | 438/689 |
| 6,497,768 B2* | 12/2002 | Bergman | 134/3 |
| 6,670,276 B1 | 12/2003 | Suemasa et al. | |
| 7,351,618 B2* | 4/2008 | Cho et al. | 438/149 |
| 2001/0002857 A1* | 6/2001 | Shimada et al. | 349/138 |
| 2002/0008818 A1* | 1/2002 | Shiota | 349/138 |
| 2004/0261817 A1 | 12/2004 | Araki et al. | |
| 2005/0034744 A1* | 2/2005 | Sohn | 134/26 |
| 2005/0153477 A1* | 7/2005 | Ammlung et al. | 438/106 |

(Continued)

FOREIGN PATENT DOCUMENTS

JP    8-153710    6/1996

(Continued)

OTHER PUBLICATIONS

Park et al, KR App 10-2001-0083316, KR Pub 10-2003-0053563, Human Translation. Pub. Jul. 2, 2003. pp. 1-22.*

(Continued)

*Primary Examiner*—Evan Pert
*Assistant Examiner*—Andres Munoz
(74) *Attorney, Agent, or Firm*—Stein McEwen, LLP

(57) ABSTRACT

In a method of fabricating organic light emitting diode display, a planarization layer is annealed, cured, provided with an ashing treatment, and surface-treated to reduce roughness of the planarization layer. Therefore, it is possible to improve reduce problems such as a decrease in reflectivity and variation of color coordinates of the organic light emitting diode display due to the roughness of the planarization layer.

19 Claims, 11 Drawing Sheets

U.S. PATENT DOCUMENTS

| | | | |
|---|---|---|---|
| 2006/0148141 A1* | 7/2006 | Seo et al. | 438/151 |
| 2007/0020825 A1* | 1/2007 | Cho et al. | 438/151 |
| 2007/0096612 A1* | 5/2007 | Li et al. | 313/112 |
| 2008/0230871 A1* | 9/2008 | Yamazaki et al. | 257/532 |

FOREIGN PATENT DOCUMENTS

| | | |
|---|---|---|
| JP | 11-52122 | 2/1999 |
| JP | 2001-118830 | 4/2001 |
| JP | 2002-250934 | 9/2002 |
| JP | 2005-39205 | 2/2005 |
| JP | 2005-276446 | 10/2005 |
| JP | 2006-222082 | 8/2006 |
| KR | 10-2001-0083316 | * 7/2003 |
| KR | 2003-53563 | 7/2003 |
| KR | 2004-25093 | 3/2004 |
| KR | 2004-49871 | 6/2004 |
| KR | 2006-55100 | 5/2006 |
| KR | 2006-94867 | 8/2006 |
| KR | 10-637188 | 10/2006 |
| KR | 2006-134471 | 12/2006 |

OTHER PUBLICATIONS

Korean Office Action issued on Oct. 17m 2008 in corresponding Korean Patent Application No. 2007-93538.

* cited by examiner

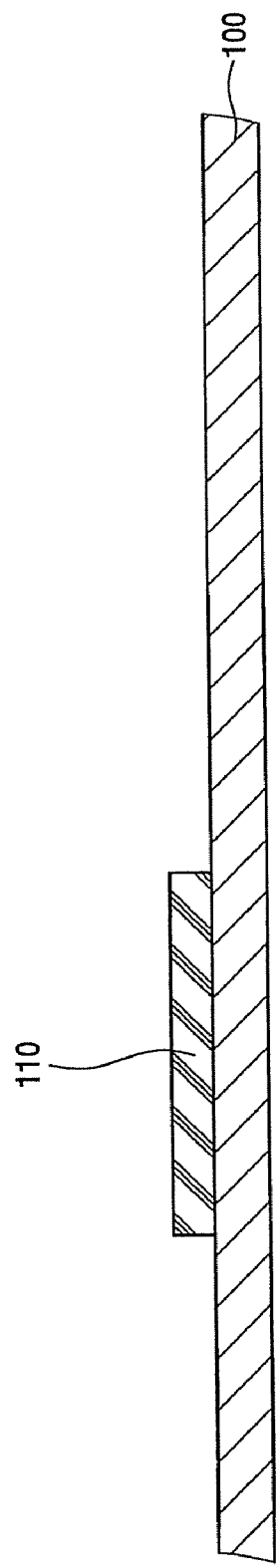

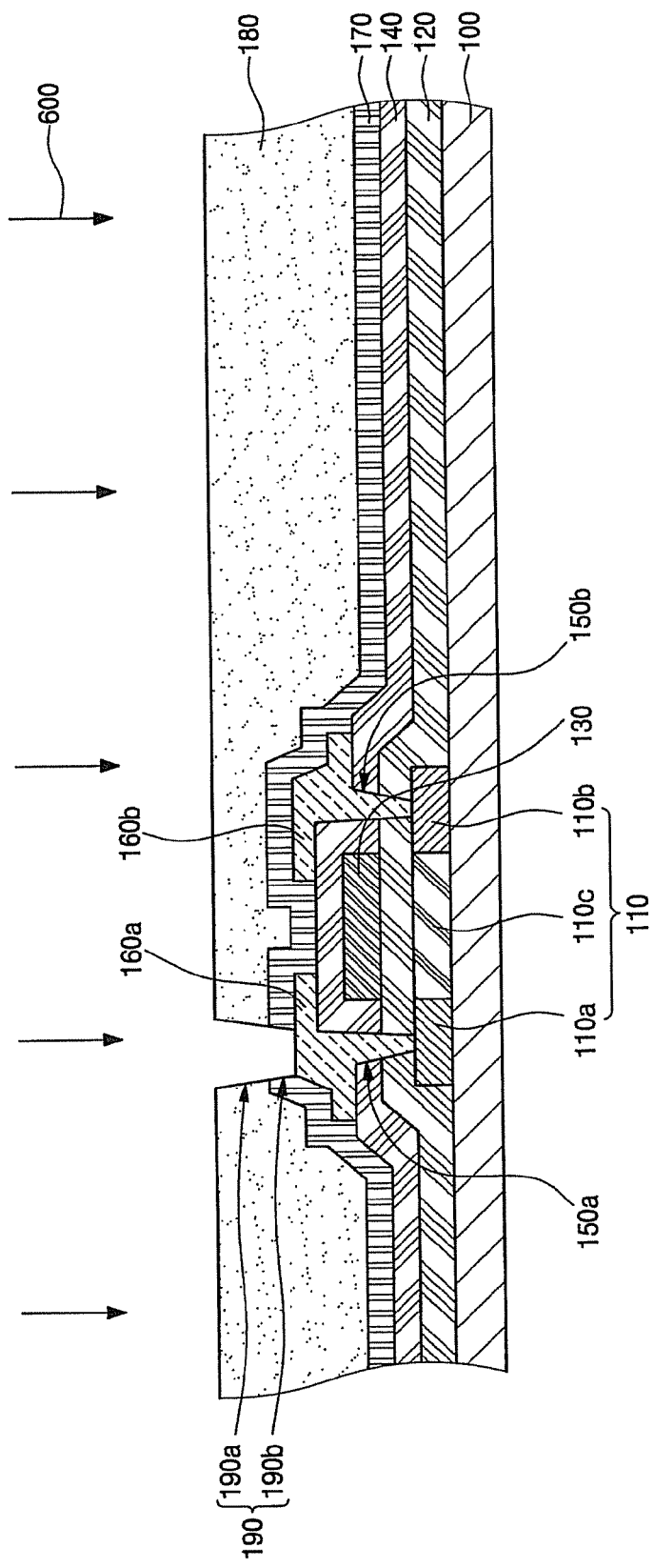

METHOD OF FABRICATING ORGANIC LIGHT EMITTING DIODE DISPLAY DEVICE

CROSS-REFERENCE TO RELATED APPLICATIONS

This application claims the benefit of Korean Application No. 2007-93538, filed Sep. 14, 2007, in the Korean Intellectual Property Office, the disclosure of which is incorporated herein by reference.

BACKGROUND OF THE INVENTION

1. Field of the Invention

Aspects of the present invention relate to a method of fabricating an organic light emitting diode (OLED) display device, and more particularly, to a method of fabricating an organic light emitting diode display device having a planarization layer.

2. Description of the Related Art

In general, flat panel displays are classified into liquid crystal displays (LCDs), field emission displays (FEDs), plasma display panels (PDPs), organic light emitting diode (OLED) display devices, and so on. OLED display devices are classified into a passive matrix OLED display device and an active matrix OLED display device depending on their drive method.

An active matrix OLED display device includes a via-hole that passes through a passivation layer and a planarization layer formed between a thin film transistor and an organic light emitting device. The via-hole may be dry etched using the planarization layer as a mask.

However, the dry etching process may cause damage to the planarization layer by increasing the roughness of projections on the planarization layer, since the planarization layer is in direct contact with plasma generated while performing the dry etching process. Eventually, the roughness of the planarization layer may result in irregular deposition of a pixel electrode including a reflective layer formed on the planarization layer, thereby causing a decrease in the reflectivity and variation of color coordinates due to scattered reflection during emission of the OLED display device.

SUMMARY OF THE INVENTION

Aspects of the present invention provide a method of fabricating an organic light emitting diode display device capable of reducing roughness of a planarization layer.

According to an embodiment of the present invention, there is provided a method of reducing a roughness of a planarization layer covering a thin film transistor in an organic light emitting diode display device, comprising annealing and curing the planarization layer after forming a first extension of a via hole in the planarization layer; dry etching the passivation layer to form a second extension of the via-hole; providing an ashing treatment to the planarization layer; and providing a surface treatment to the planarization layer.

According to an embodiment of the present invention, there is provided a method of fabricating an organic light emitting diode display device including: forming a thin film transistor on a substrate; forming a passivation layer on the entire surface of the substrate; forming a planarization layer on the passivation layer; exposing and developing the planarization layer to form a first extension of a via-hole exposing a portion of the passivation layer formed on a source electrode or a portion of the passivation layer formed on a drain electrode of the thin film transistor; annealing and curing the planarization layer; dry etching the passivation layer to form a second extension of the via-hole; providing an ashing treatment of the planarization layer; forming a pixel electrode on the planarization layer connected to the source electrode or the drain electrode through the via-hole; forming an organic layer including an organic emission layer on the pixel electrode; and forming an opposite electrode on the entire surface of the substrate.

Therefore, by reducing the roughness of the planarization layer, the method of fabricating an organic light emitting diode display device can reduce problems such as a decrease in reflectivity and a variation of color coordinates due to scattered reflection.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1A to 1I are cross-sectional views showing a method of fabricating an organic light emitting diode display device in accordance with an exemplary embodiment of the present invention;

DETAILED DESCRIPTION OF THE EMBODIMENTS

Figure 1B:
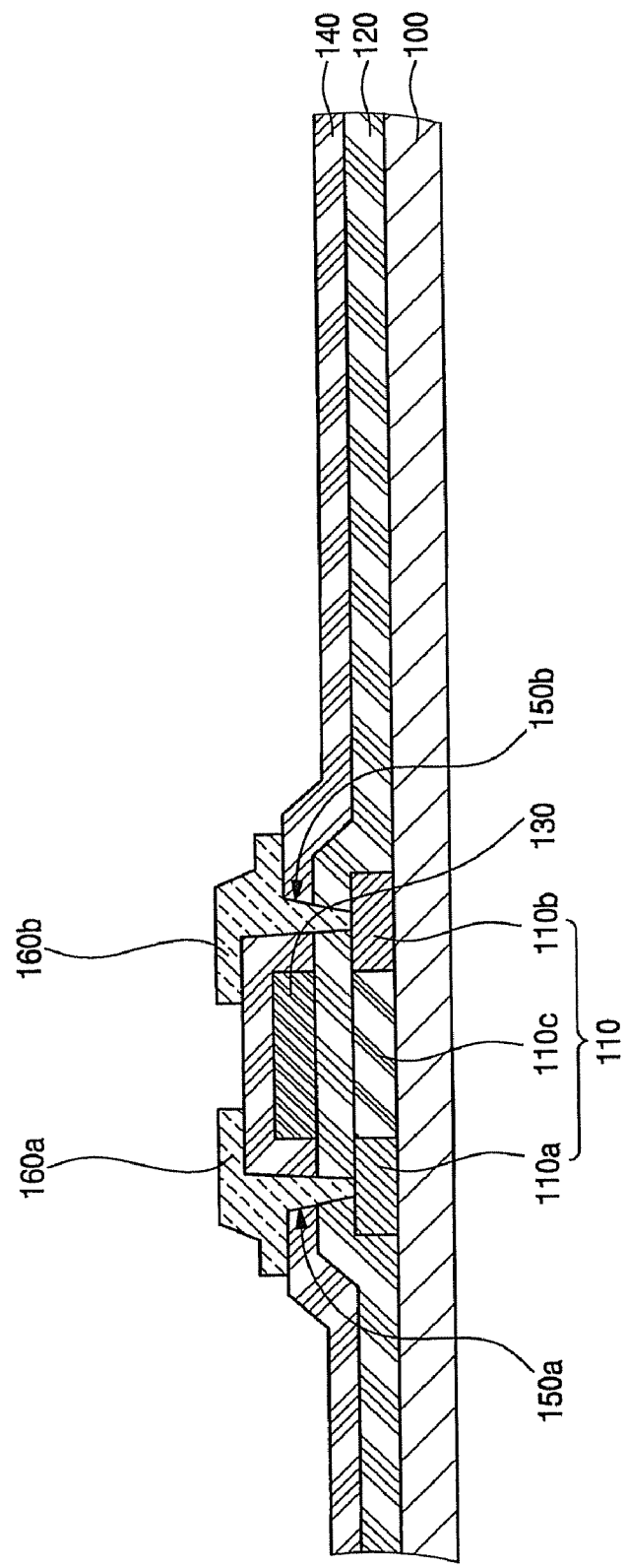

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Herein, it is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

FIGS. 1A to 1I are cross-sectional views showing a method of fabricating an organic light emitting diode display device in accordance with an embodiment of the present invention.

First, referring to FIG. 1A, a buffer layer (not shown) is formed on an insulating substrate 100 formed of glass or plastic. The buffer layer may be formed using a chemical vapor deposition (CVD) method or a physical vapor deposition (PVD) method.

The buffer layer prevents the diffusion of moisture or impurities generated from the substrate 100 and/or adjusts a heat transfer speed during crystallization, thereby facilitating crystallization of an amorphous silicon layer.

Then, the amorphous silicon layer (not shown) is formed on the buffer layer. The amorphous silicon layer may be formed using a PVD method such as sputtering, or a CVD method such as plasma enhanced chemical vapor deposition (PECVD) or low pressure chemical vapor deposition (LPCVD).

In addition, the amorphous silicon layer may be dehydrated during or after the forming of the amorphous silicon layer to decrease the concentration of hydrogen of the amorphous silicon layer.

The amorphous silicon layer is crystallized to form a polysilicon layer. The amorphous silicon layer may be crystallized by methods such as excimer laser annealing (ELA), sequential lateral solidification (SLS), metal induced crystallization (MIC), metal induced laser crystallization (MILC), super grained silicon (SGS), or the like. The formed polysilicon layer is patterned to form a semiconductor layer 110 having a predetermined pattern.

Referring to FIG. 1B, a gate insulating layer 120 is formed on the entire surface of the substrate having the semiconductor layer 110 to protect devices formed thereunder, which are electrically isolated from devices formed thereon by the gate insulating layer 120.

A gate metal layer (not shown) made of aluminum (Al), aluminum alloy, molybdenum (Mo), or molybdenum alloy, is formed on the gate insulating layer 120.

The gate metal layer is patterned to form a gate electrode 130 corresponding to a predetermined region of the semiconductor layer 110.

N-type or P-type impurities are implanted using the gate electrode 130 as a mask to form source and drain regions 110a and 110b on the semiconductor layer 110. A channel region 110c, in which a channel is formed when the thin film transistor is driven, is provided as a region in which impurities are not implanted because of masking by the gate electrode 130.

An interlayer insulating layer 140 is formed on the entire surface of the substrate. The interlayer insulating layer 140 functions to protect and electrically isolate the devices formed thereunder. The buffer layer (not shown), the gate insulating layer 120, and the interlayer insulating layer 140 may be a single layer formed of $SiO_2$ or $SiN_x$, or may be a multi-layer including layers of $SiO_2$ and/or $SiN_x$.

Contact holes 150a and 150b are formed to pass through the interlayer insulating layer 140 and the gate insulating layer 120 to expose a portion of the source and drain regions 110a and 110b of the semiconductor layer 110, respectively.

Next, source and drain electrodes 160a and 160b are formed in a predetermined pattern on the interlayer insulating layer 140 to be connected to the source and drain regions 110a and 110b of the semiconductor layer 110 through the contact holes 150a and 150b to form a thin film transistor.

The source and drain electrodes 160a and 160b may be formed of a material selected from aluminum (Al), aluminum alloy, molybdenum (Mo), and molybdenum alloy.

Figure 1C:
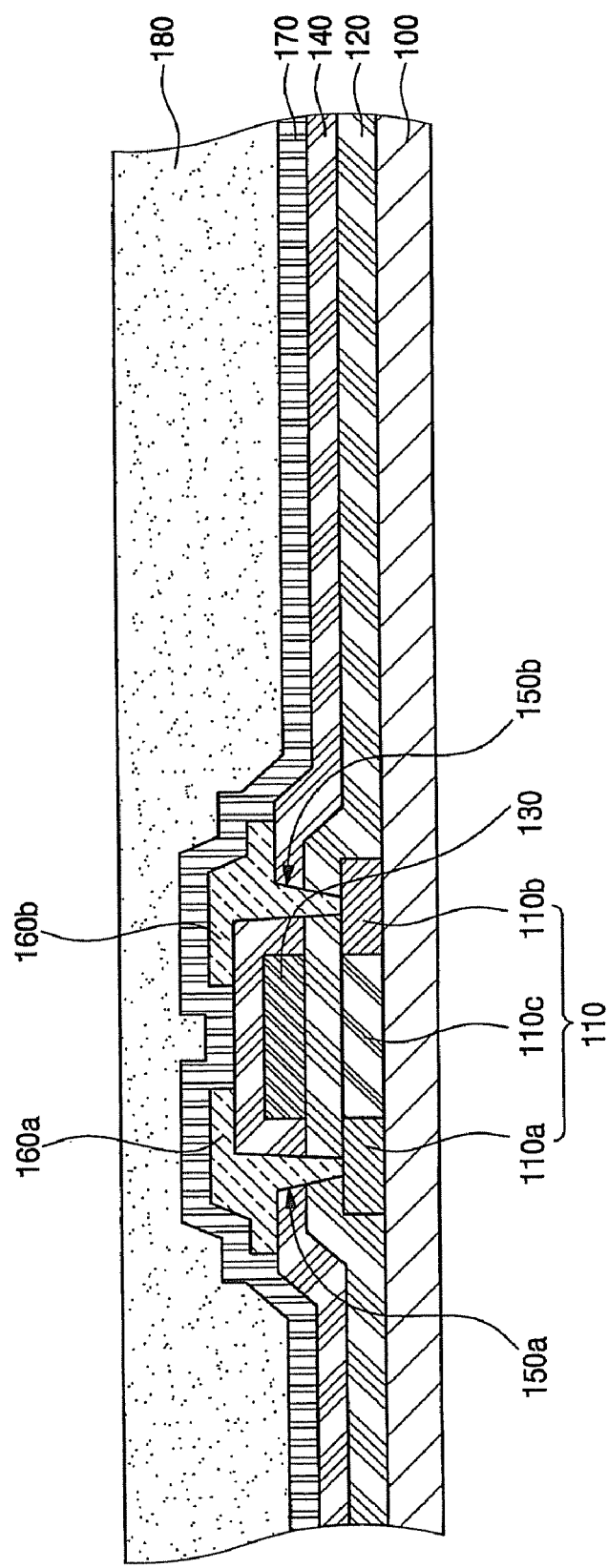

Next, referring to FIG. 1C, a passivation layer 170 is formed on the entire surface of the thin film transistor, and the passivation layer 170 may be a single layer formed of $SiO_2$ or $SiN_x$, or may be a multi-layer including layers of $SiO_2$ and/or $SiN_x$.

A planarization layer 180 is formed on the passivation layer 170 in order to attenuate steps on the substrate. The planarization layer 180 is an organic layer that may be formed, for example, of a photosensitive material selected from the group consisting of an acryl resin, benzocyclobutene (BCB), and a polyimide resin.

Figure 1D:
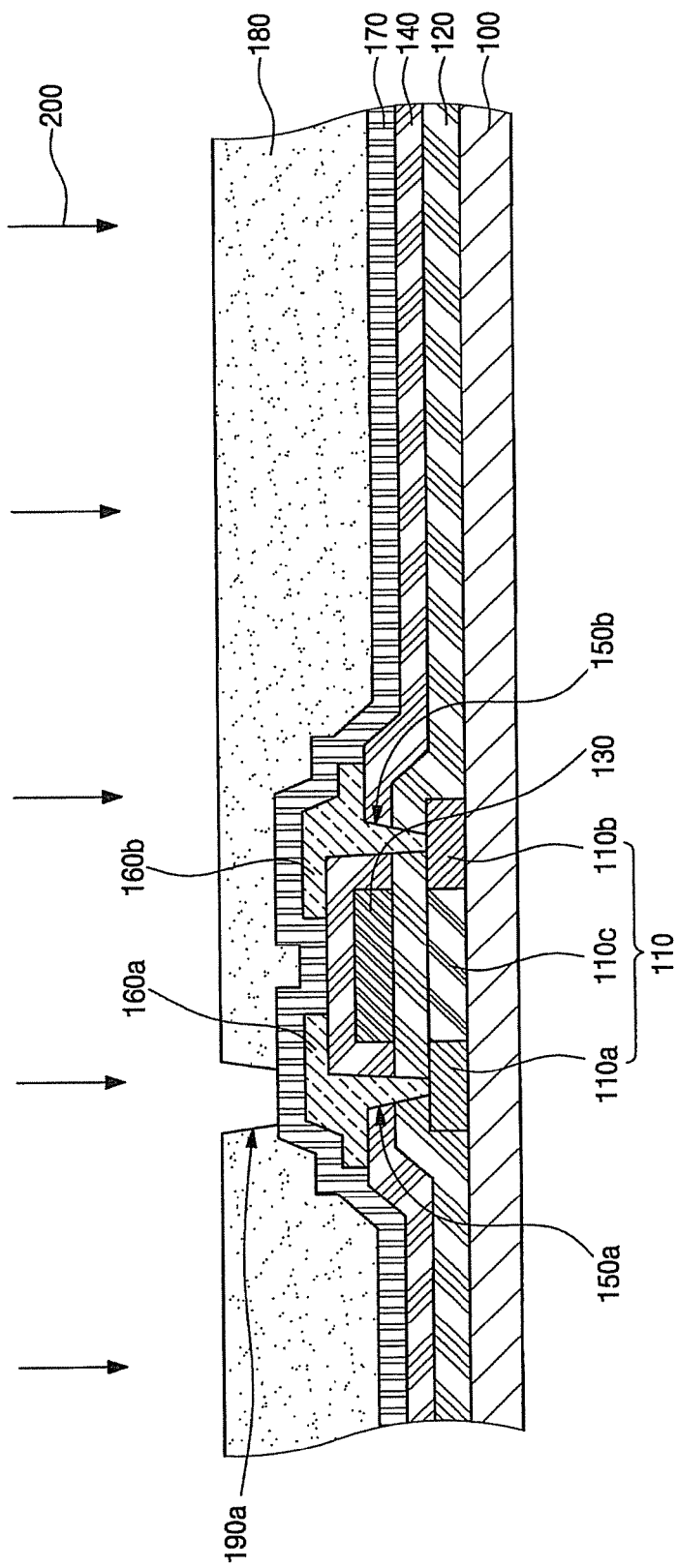

Referring to FIG. 1D, an exposure and development process 200 is performed to form a first extension 190a of a via hole 190 (see FIGS. 1F-1I) in the planarization layer 180 to expose a portion of the passivation layer 170 formed on the source electrode 160a (this alternative is shown in FIG. 1D) or a portion of the passivation layer 170 formed on the drain electrode 160b (this alternative is not shown in FIG. 1D).

Figure 1E:
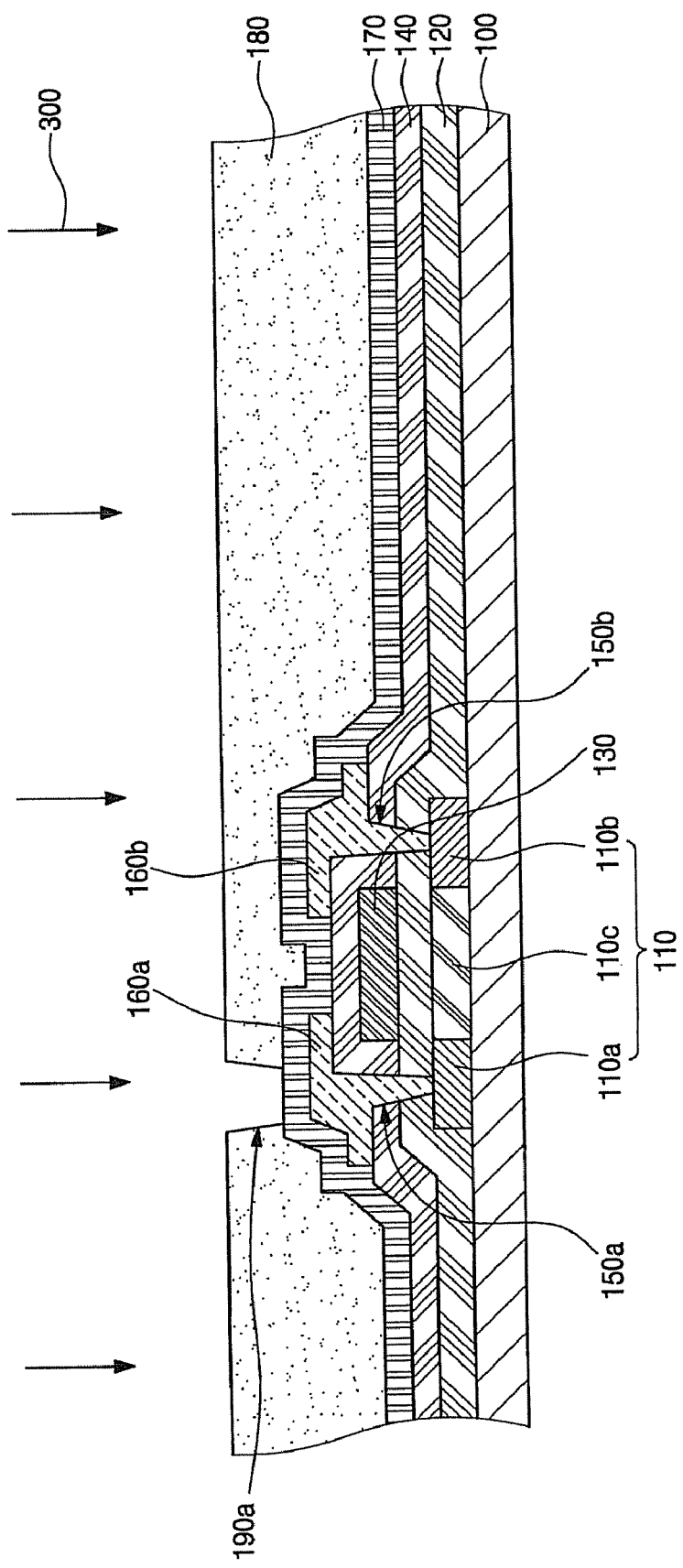

Referring to FIG. 1E, the planarization layer 180 is annealed 300. The annealing process 300 is performed in a vacuum chamber at a temperature of 200-300° C. for 1 or 2 hours to cure the planarization layer 180.

The annealing process 300 to securely cure the planarization layer 180 is performed to reduce roughness of the planarization layer 180 generated when a subsequent dry etching process is performed using the planarization layer 180 having the first extension 190a of the via hole 190 as a mask to form a second extension 190b of the via-hole 190.

Figure 1F:
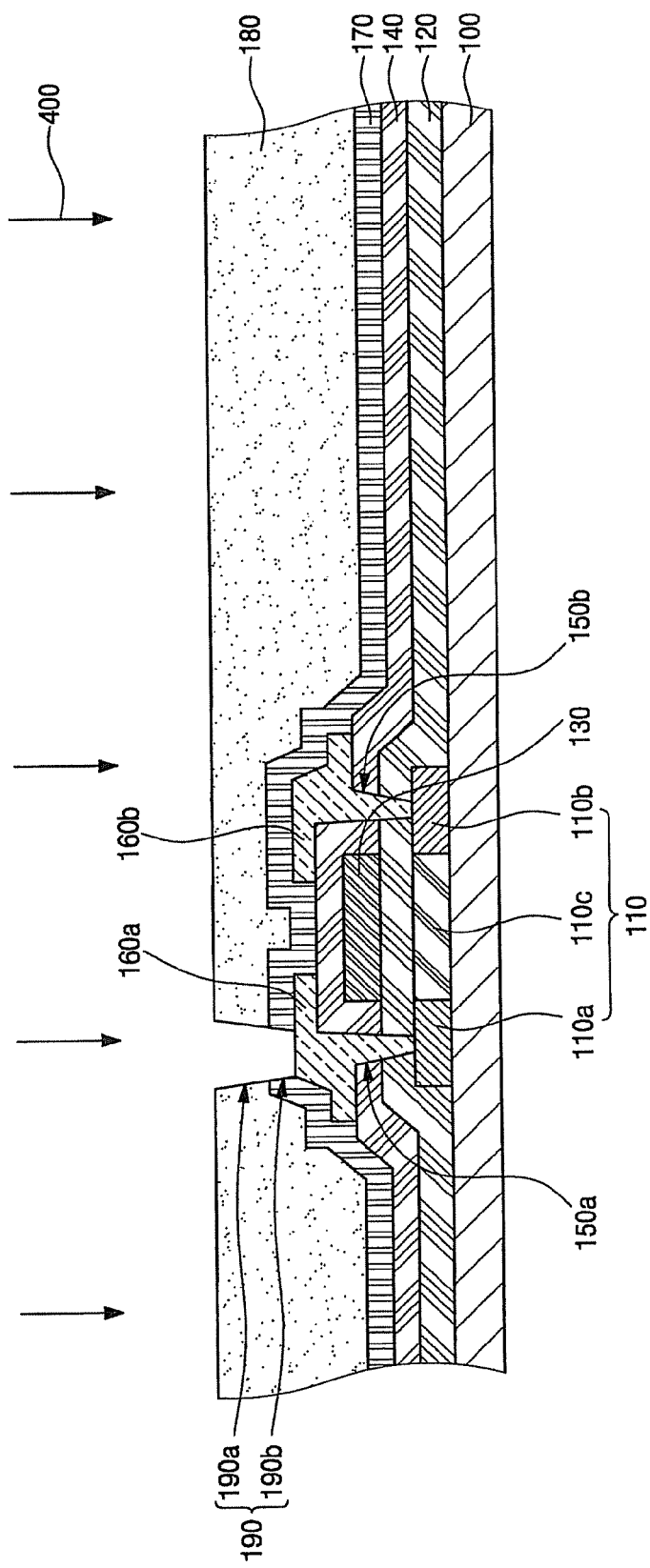

Referring to FIG. 1F, the passivation layer 170 is dry etched 400 using the planarization layer 180 having the first extension 190a of the via-hole 190 as a mask. The second extension 190b of the via-hole 190 is formed in the passivation layer 170 exposed by the first extension 190a of the via-hole 190 in the planarization layer 180.

Therefore, the second extension 190b of the via-hole is formed to pass through the passivation layer 170 to thereby expose a portion of the source electrode 160a (as shown in FIG. 1D) or a portion of the drain electrode 160b, and thus, a via-hole 190 comprising the first extension 190a and the second extension 190b is completed.

More specifically, the dry etching process 400 may be performed using a method selected from the group consisting of reactive ion etching, plasma etching, and inductively coupled plasma etching.

Figure 1G:
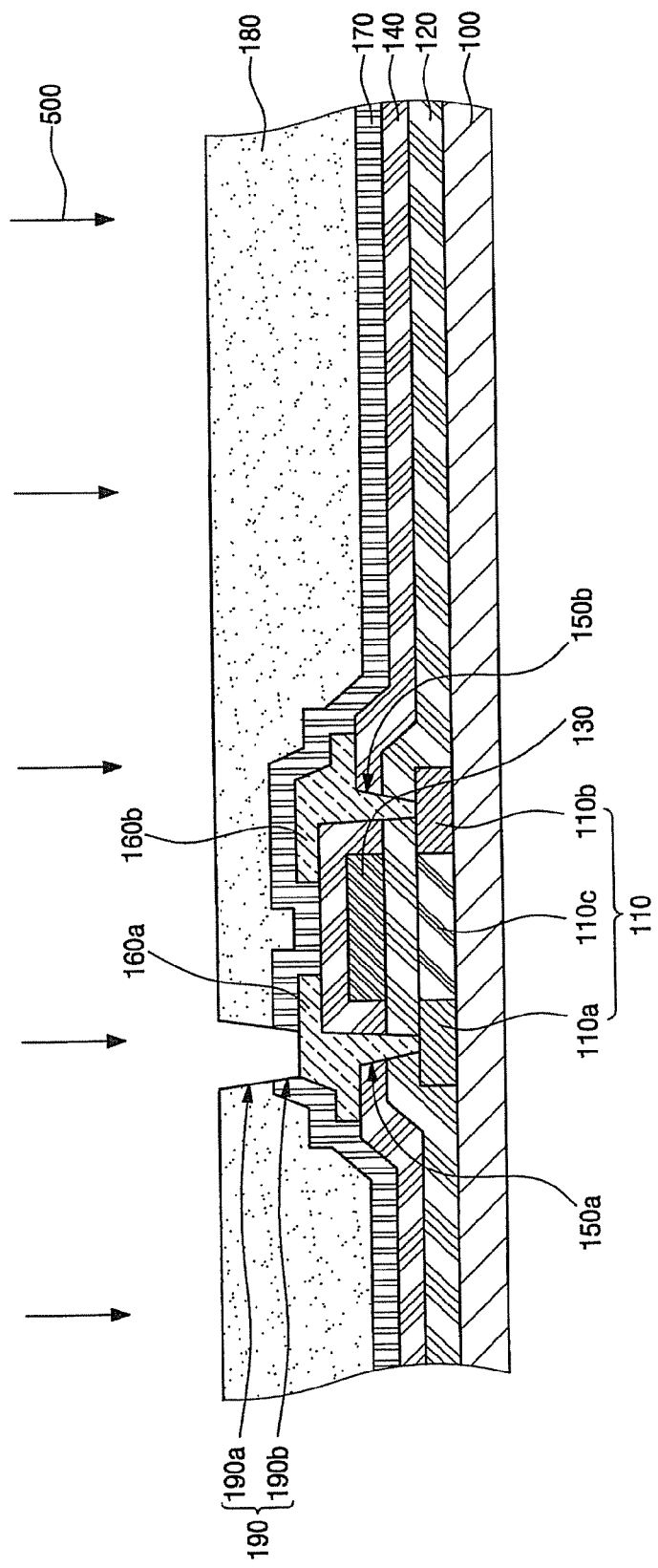
Figure 11:
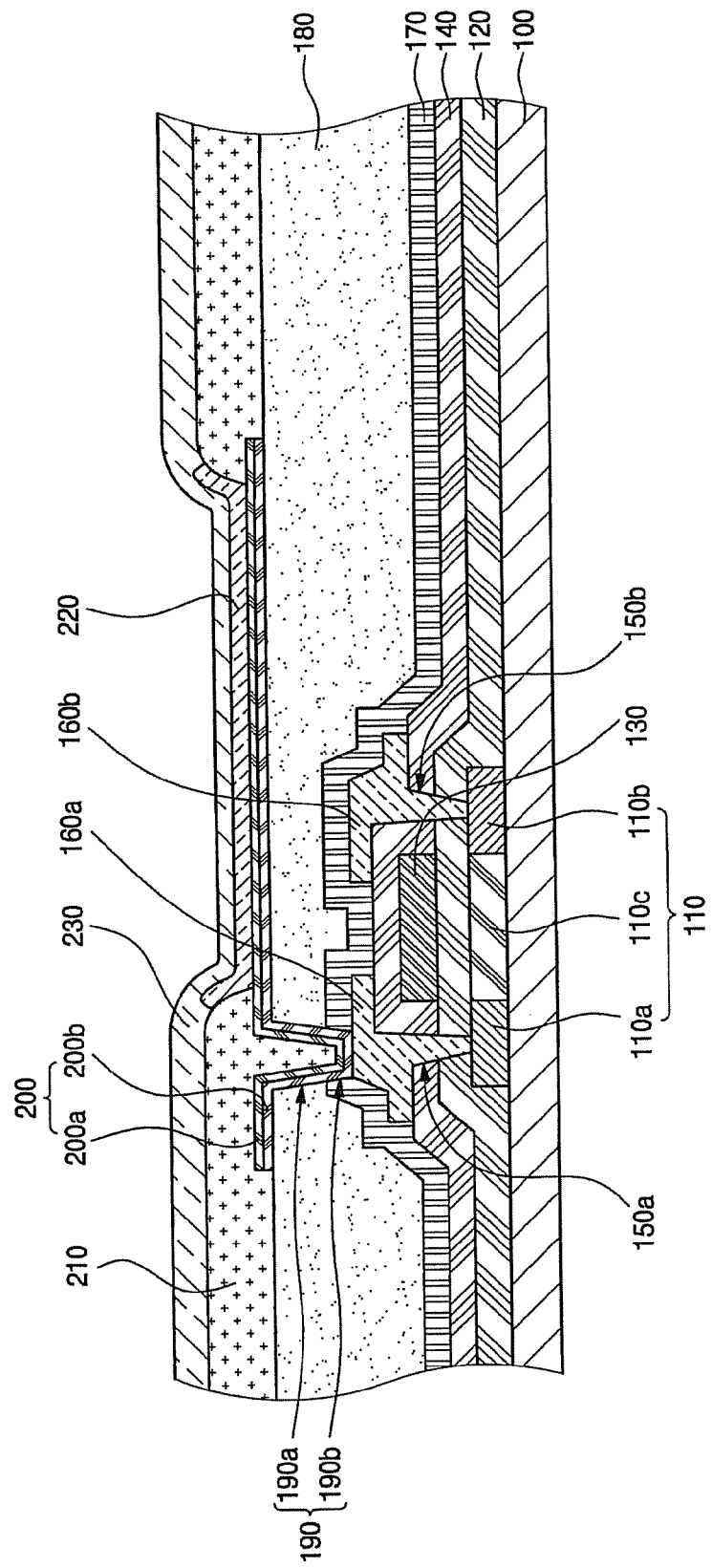

Referring to FIG. 1G, the planarization layer 180 is subjected to an ashing treatment 500. The ashing treatment 500 is performed with a process pressure of 100-200 mTorr, a source power of 1 kW-2 kW, a bias power of 200-500 W, and an oxygen flow rate of 200-1000 sccm.

In order to minimize the roughness of the planarization layer 180, the process pressure of the ashing treatment may be optimized. The lower the process pressure, the higher the ashing speed and the greater the roughness. On the other hand, the higher the process pressure, the lower the ashing speed and the lesser the roughness.

The reason for performing the ashing treatment 500 is that it may be difficult to reduce the roughness generated during the dry etching process 400 through curing of the planarization layer 180 by the annealing process 300.

Referring to FIG. 1H, a surface treatment 600 is further performed on the planarization layer 180 to reduce the roughness of the planarization layer 180. The surface treatment 600 may be performed using a method selected from a surface treatment in a development solution for a period of 0.5 to 5 minutes, a surface treatment including exposure to extreme ultraviolet rays (EUV) for a period of 0.5 to 5 minutes, and surface treatment using ozone ($O_3$) water for a period 0.5 to 5 minutes, or the above methods may be continuously performed.

As a non-limiting example, the development solution may use a conventional organic development solution such as 2.38 wt % tetra methyl ammonium hydroxide (TMAH) alkali solution.

Next, referring to FIG. 1I, a pixel electrode 200 including a reflective layer 200b and a transparent electrode 200a is formed on the planarization layer 180. The pixel electrode 200 is connected to the source electrode 160a (as shown in FIG. 1I) or the drain electrodes 160b exposed by the via-hole 190.

The pixel electrode 200 may have a structure in which the transparent electrode 200a formed of indium tin oxide (ITO) or indium zinc oxide (IZO) is deposited on the reflective electrode 200b formed of a material selected from the group consisting of Pt, Au, Ir, Cr, Mg, Ag, Al, and an alloy thereof.

A pixel-defining layer 210 including an opening exposing a predetermined region of the pixel electrode 200 is formed on the entire surface of the substrate. The pixel-defining layer 210 may be formed of a material selected from the group consisting of benzocyclobutene (BCB), acryl-based polymer, and polyimide.

Then, an organic layer 220 including an organic emission layer (not shown) is formed on the pixel electrode 200 exposed by the opening, and an opposite electrode 230 is formed on the entire surface of the substrate to implement an organic light emitting diode display device.

Hereinafter, Examples and a Comparative Example will be described for the convenience of understanding. The Examples are described for the purpose of illustration only, not limiting the present invention.

Example 1

First, as described in the embodiment with reference to the drawings, a thin film transistor was formed on the substrate, and a passivation layer formed of $SiN_x$ was deposited on the thin film transistor.

Then, a planarization layer formed of acryl resin was deposited on the passivation layer.

Next, an exposure and development process was performed on the planarization layer to form a first extensions of a via-hole to expose a predetermined region of the passivation layer 170 formed on the source 160a of the thin film transistor.

The planarization layer having the first portion of the via-hole formed therein was annealed. The annealing process was performed in a vacuum chamber at a temperature of 250° C. for one hour to cure the planarization layer.

Then, a dry etching process using inductively coupled plasma (ICP) was performed using the planarization layer having the first portion of the via-hole formed therein as a mask to form a second extension of the via-hole exposing a predetermined region of the source electrode.

Then, an ashing treatment was performed to reduce the surface roughness of the planarization layer. The ashing treatment 500 was performed at a process pressure of 150 mTorr, a source power of 1.5 kW, a bias power of 350 W, and an oxygen flow rate of 500 sccm.

Next, a surface treatment was performed to improve the roughness of the planarization layer. The surface treatment was carried out by applying a development solution comprising 2.38 wt % tetra methyl ammonium hydroxide (TMAH) to the planarization layer for one minute.

Example 2

A passivation layer having a via hole was formed on a thin film transistor in the same manner as described in Example 1, except that the surface treatment was performed using continuously extreme ultraviolet rays (EUV) and a development solution comprising 2.38 wt % tetra methyl ammonium hydroxide (TMAH) for one minute, respectively.

Exemplary Embodiment 3

A passivation layer including a via hole was formed on a thin film transistor in the same manner as described in Example 1, except that the surface treatment was performed using continuously extreme ultraviolet rays (EUV) and ozone ($O_3$) water for one minute, respectively.

Comparative Example

A passivation layer 170 having a via hole was formed on a thin film transistor in the same manner as described in Example 1, except that the annealing process, the ashing treatment and the surface treatment were not performed.

Figure 2:
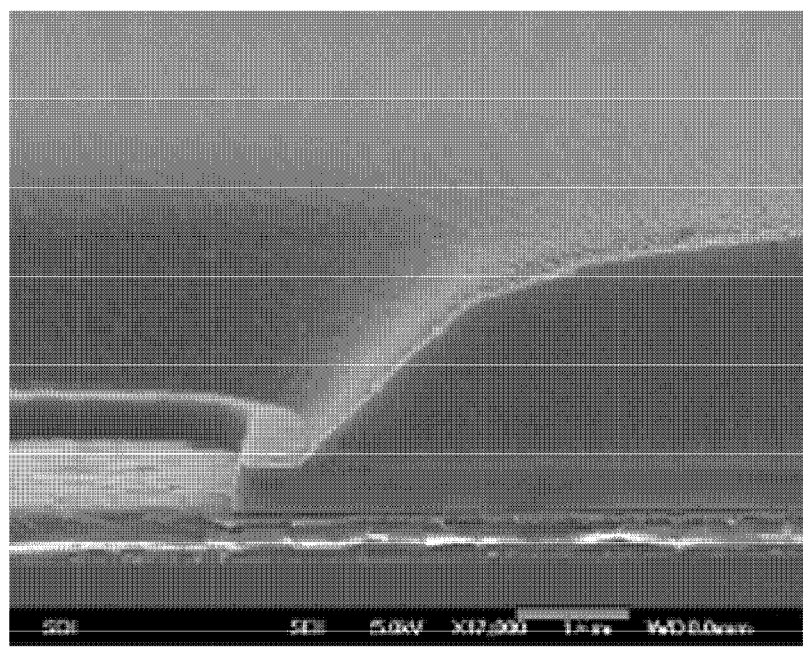
FIG. 2 is a scanning electron microscope (SEM) photograph showing the roughness of the planarization layer formed according to Example 1.
Figure 3:
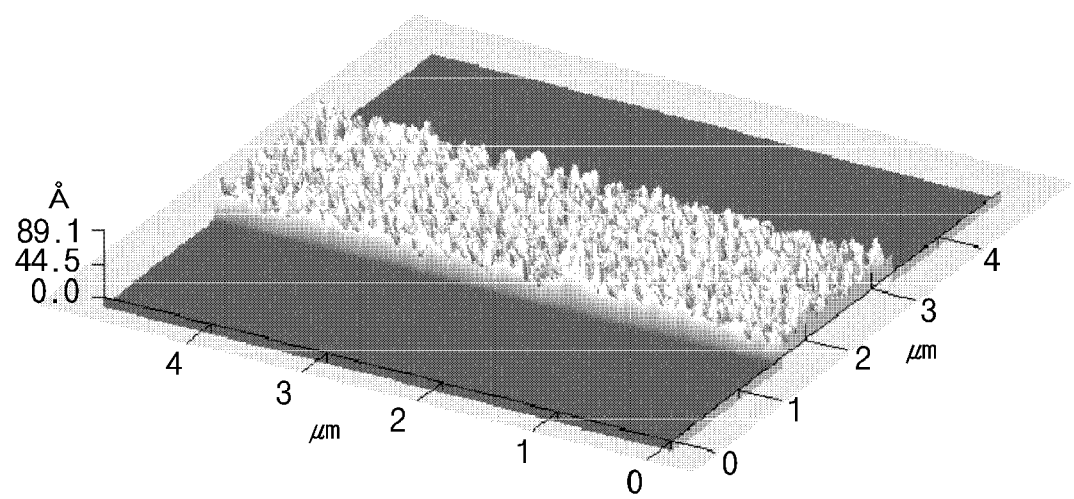
FIG. 3 is an atomic force microscopy (AFM) image showing the roughness of the planarization layer formed according to Example 2.
Figure 4:
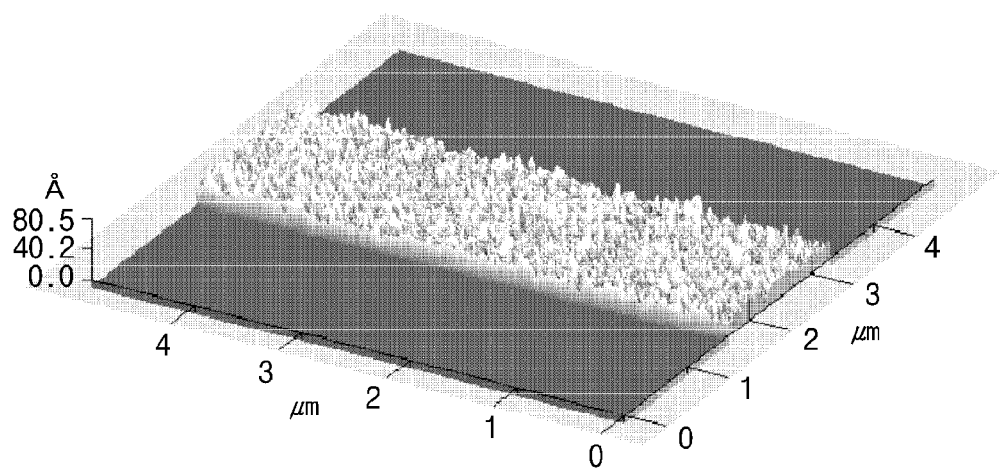
FIG. 4 is an atomic force microscopy (AFM) image showing the roughness of the planarization layer formed according to Example 3.
Figure 5:
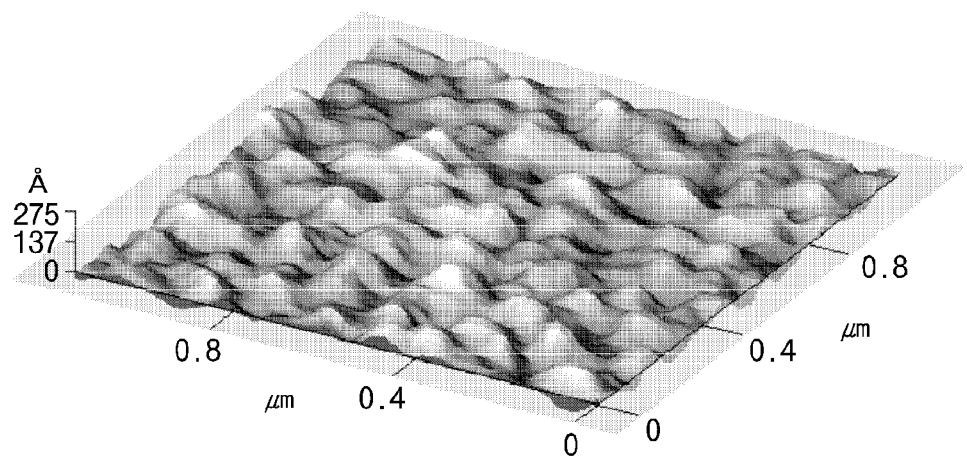
FIG. 5 is an atomic force microscopy (AFM) image showing the roughness of the planarization layer formed according to the Comparative Example.

FIGS. 2 to 5 are images showing the roughness of the respective planarization layers of Examples 1 to 3 and the Comparative Example. In particular, FIG. 2 is a scanning electron microscope (SEM) image showing the roughness of the planarization layer formed according to Example 1. FIG. 3 is an atomic force microscopy (AFM) image showing the roughness of the planarization layer formed according to Example 2. FIG. 4 is an atomic force microscopy (AFM) image showing the roughness of the planarization layer formed according to Example 3. FIG. 5 is an atomic force microscopy (AFM) image showing the roughness of the planarization layer formed according to the Comparative Example.

Root mean square (RMS) values of the roughness of the planarization layers of Examples 1 to 3 and the Comparative Example were calculated from the roughness data provided with reference to FIGS. 2 to 5. The RMS values are shown in the following Table 1.

TABLE 1

|  | Example 1 | Example 2 | Example 3 | Comparative Example |
|---|---|---|---|---|
| Roughness of Planarization Layer (RMS) | 14.8 Å | 12.5 Å | 10 Å | 78.6 Å |

Referring to Table 1, it will be appreciated that the planarization layers of Examples 1 to 3, in which the annealing process, the ashing treatment 500, and the surface treatment 600 in accordance with aspects of the present invention were performed, have a roughness that is significantly smaller than the planarization layer of Comparative Example, in which was annealing, ashing and surface treatments were not performed.

In particular, it will be appreciated that, in comparison with the RMS roughness of 78.6 Å in the Comparative Example, the RMS roughness of 14.8 Å in Example 1, in which the surface treatment was carried out by applying a development solution, the RMS roughness of 12.5 Å in Exemplary Embodiment 2, in which the surface treatment was carried out using ultraviolet rays and the development solution, and the RMS roughness of 10 Å in Exemplary Embodiment 3, in which the surface treatment was carried out using ultraviolet rays and ozone water, provide a significant improvement.

Therefore, as non-limiting examples, the surface treatment may be carried out using a development solution, ultraviolet rays, or ozone water.

While aspects of the present invention are applied to a top emission organic light emitting diode display device including a pixel electrode having a reflective layer, it is to be understood that the present invention is not limited to this embodiment. For example, a structure including the passivation layer and the planarization layer, not including the reflective layer, may also be used according to aspects of the present invention.

In addition, it is to be understood that the thin film transistor is not limited to a top gate electrode structure, but a thin film transistor having a bottom gate electrode structure may also be used.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of reducing a roughness of a planarization layer covering a thin film transistor in an organic light emitting diode display device, comprising:
    annealing and curing the planarization layer after forming a first extension of a via hole in the planarization layer;
    providing an ashing treatment to the planarization layer after forming a second extension of the via hole by dry etching; and
    providing a surface treatment to the planarization layer after the ashing treatment
    wherein the surface treatment comprises at least one of: exposing the planarization layer to a development solution; exposing the planarization layer to extreme ultraviolet rays (EUV); or exposing the planarization layer to ozone ($O_3$) water.

2. The method according to claim 1, wherein the annealing and curing is performed at a temperature of 200 to 300° C. for 1 to 2 hours.

3. The method according to claim 1, wherein the ashing treatment is performed at a process pressure of 100-200 mTorr, a source power of 1 kW-2 kW, a bias power of 200-500 W, and an oxygen flow rate of 200-1000 sccm.

4. The method of claim 1, wherein the planarization layer is a photosensitive material selected from the group consisting of acryl resin, benzocyclobutene (BCB), and polyimide resin.

5. The method of claim 1, wherein a development solution of the surface treatment comprises tetra methyl ammonium hydroxide.

6. A method of fabricating an organic light emitting diode display device, comprising:
    forming a thin film transistor on a substrate;
    forming a gate insulating layer on the substrate;
    forming an interlayer insulating layer on the substrate;
    forming a passivation layer on the entire surface of the substrate;
    forming a planarization layer on the passivation layer;
    exposing and developing the planarization layer to form a first extension of a via-hole exposing a portion of the passivation layer formed on a source electrode or a portion of the passivation layer formed on a drain electrode of the thin film transistor;
    annealing and curing the planarization layer after the exposing and the developing of the planarization layer;
    dry etching the passivation layer to form a second extension of the via-hole;
    providing an ashing treatment of the planarization layer;
    providing a surface treatment after the ashing treatment of the planarization layer;
    forming a pixel electrode on the planarization layer connected to the source electrode or the drain electrode through the via-hole;
    forming an organic layer including an organic emission layer on the pixel electrode; and
    forming an opposite electrode on the entire surface of the substrate,
    wherein the surface treatment comprises at least one of: exposing the planarization layer to a development solution; exposing the planarization layer to extreme ultraviolet rays (EUV); or exposing the planaraization layer to ozone ($O_3$) water.

7. The method according to claim 6, wherein the annealing and curing is performed at a temperature of 200 to 300° C. for 1 to 2 hours.

8. The method according to claim 6, wherein the annealing and curing is performed at a temperature of 250° C. for 1 hour.

9. The method according to claim 6, wherein the ashing treatment is performed at a process pressure of 100-200 mTorr, a source power of 1 kW-2 kW, a bias power of 200-500 W, and an oxygen flow rate of 200-1000 sccm.

10. The method according to claim 6, wherein the ashing treatment is performed at a process pressure of 150 mTorr, a source power of 1.5 kW, a bias power of 350 W, and an oxygen flow rate of 500 sccm.

11. The method of claim 6, wherein the surface treatment is carried out for 0.5 to 5 minutes.

12. The method of claim 6, wherein the development solution comprises tetra methyl ammonium hydroxide.

13. The method according to claim 6, wherein the surface treatment is provided by exposing the planarization layer to a development solution of 2.38 wt % tetra methyl ammonium hydroxide for 1 minute.

14. The method according to claim 6, wherein the surface treatment is provided by exposing the planarization layer to extreme ultraviolet rays (EUV) and a development solution of 2.38 wt % tetra methyl ammonium hydroxide for 1 minute.

15. The method according to claim 6, wherein the surface treatment is provided by exposing the planarization layer to continuously ozone water and a development solution of 2.38 wt % tetra methyl ammonium hydroxide for one minute.

16. The method according to claim 6, wherein the pixel electrode further comprises a reflective layer.

17. The method according to claim 6, wherein the second extension of the via-hole is formed through dry etching using the planarization layer as a mask.

18. The method according to claim 6, wherein the dry etching is carried out by reactive ion etching, plasma etching, or inductively coupled plasma etching.

19. The method of claim 6, wherein the planarization layer is a photosensitive material selected from the group consisting of acryl resin, benzocyclobutene (BCB), and polyimide resin.

* * * * *